United States Patent
Na

(10) Patent No.: US 8,673,723 B1
(45) Date of Patent: Mar. 18, 2014

(54) METHODS OF FORMING ISOLATION REGIONS FOR FINFET SEMICONDUCTOR DEVICES

(71) Applicant: Globalfoundries Inc., Grand Cayman, KY (US)

(72) Inventor: Kyu Tae Na, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/761,610

(22) Filed: Feb. 7, 2013

(51) Int. Cl.
*H01L 21/00* (2006.01)

(52) U.S. Cl.
USPC .......................................... 438/296; 438/301

(58) Field of Classification Search
USPC .......................................... 438/296, 301–305
See application file for complete search history.

(56) References Cited

U.S. PATENT DOCUMENTS

| | | | |
|---|---|---|---|
| 5,889,312 A | 3/1999 | Miura et al. | |
| 6,740,933 B2 | 5/2004 | Yoo et al. | |
| 6,876,053 B1 | 4/2005 | Ma et al. | |
| 6,974,981 B2 | 12/2005 | Chidambarrao et al. | |
| 6,995,447 B2 | 2/2006 | Lee et al. | |
| 7,410,858 B2 | 8/2008 | Ma et al. | |
| 7,521,378 B2* | 4/2009 | Fucsko et al. | 438/781 |
| 7,557,420 B2* | 7/2009 | Fucsko et al. | 257/499 |
| 7,804,152 B2 | 9/2010 | Yeh et al. | |
| 7,846,812 B2 | 12/2010 | Hill | |
| 7,892,919 B2 | 2/2011 | Kim et al. | |
| 7,968,948 B2 | 6/2011 | Eun | |
| 8,115,273 B2 | 2/2012 | Moens et al. | |
| 2001/0021567 A1 | 9/2001 | Takahashi | |
| 2005/0124101 A1* | 6/2005 | Beintner | 438/197 |
| 2011/0042777 A1 | 2/2011 | Jhang et al. | |
| 2013/0200468 A1* | 8/2013 | Cai et al. | 257/401 |

* cited by examiner

*Primary Examiner* — Richard Booth
(74) *Attorney, Agent, or Firm* — Amerson Law Firm, PLLC

(57) ABSTRACT

One method includes forming first trenches in a semiconducting substrate to define at least one fin for a FinFET device, forming a second trench in the substrate that is wider than the first trenches, forming a flowable oxide material in the first and second trenches, removing substantially all the flowable oxide material from the second trench and a portion of the flowable oxide material from the first trenches, forming a thermal oxide material in the first trenches above the flowable oxide material and in the second trench, removing substantially all of the thermal oxide material from the second trench and a portion of the thermal oxide material from the first trenches, depositing a silicon dioxide material in the first trenches above the thermal oxide material and in the second trench, removing the silicon dioxide material from the first trenches, and forming a gate structure around the fin of the device.

10 Claims, 7 Drawing Sheets

METHODS OF FORMING ISOLATION REGIONS FOR FINFET SEMICONDUCTOR DEVICES

BACKGROUND OF THE INVENTION

1. Field of the Invention

Generally, the present disclosure relates to the manufacture of sophisticated semiconductor devices, and, more specifically, to various methods of forming isolation regions for FinFET semiconductor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a three-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the depletion width under the channel and thereby reduce so-called short channel effects. Also, in a FinFET, the junction capacitance at the drain region of the device is greatly reduced, which tends to reduce at least some short channel effects.

To make an integrated circuit on a semiconducting substrate, the various semiconductor devices, e.g., transistors, capacitors, etc., are electrically isolated from one another by so-called isolation structures. Currently, most sophisticated integrated circuit devices employ so-called shallow trench isolation (STI) structures. As the name implies, STI structures are made by forming a relatively shallow trench in the substrate and thereafter filling the trench with an insulating material, such as silicon dioxide. Such STI structures are typically the very first structures that are formed when manufacturing semiconductor devices. Additionally, very large field isolation regions are formed on a substrate to isolate relative large areas of the substrate.

In general, the formation of a FinFET device involves forming a plurality of trenches in the substrate and eventually filling a portion of those trenches with insulating material. The insulating material within the trenches is generally referred to as local isolation regions for the FinFET device. As device dimensions have decreased, additional problems with the formation of FinFET devices have arisen, particularly as it relates to the formation of local isolation regions, device isolation regions and field isolation regions for FinFET devices. For example, as the width of the fins get smaller, e.g., less than about 30 nm, and as trench width also becomes smaller, it is very difficult to reliably fill such trenches with the local isolation material. Additionally, to the extent a relatively high temperature deposition process is performed to form a liner on the fins after they are formed, the fins may exhibit some undesirable "bending" from their desired perpendicular orientation relative to the surface of the substrate. Such bending tends to make it even more difficult to reliably fill the trenches that define the fins with a void-free insulating material, as "pinch-off" problems are more likely with the smaller-sized trenches.

Efforts to resolve some of the problems above have resulted in device designers implementing several process flows in attempts to solve such problems. However, some of the prior art techniques that have been employed in an attempt to rectify such problems have caused other problems. FIGS. 1A-1E depict several illustrative prior art techniques that have been employed in manufacturing various isolation regions on FinFET devices.

FIG. 1A depicts a prior art FinFET device at the point in fabrication wherein a plurality of fin-forming trenches 12 and a trench 12A for a field isolation region have been formed in a semiconducting substrate 10. The fin-forming trenches 12 define a plurality of fins 14. The size and number of the fins 14 and the trenches 12, 12A may vary.

FIG. 1B depicts one prior art technique wherein multiple layers of spin-on-glass material 16A-16D were formed in the trenches 12, 12A. Typically, a conformably deposited liner layer (not shown) comprised of silicon dioxide was formed in the trenches 12, 12A prior to the formation of the spin-on-glass material 16A-16D. The number of layers of spin-on-glass material depicted in FIG. 1B is by way of example only. Unfortunately, due to the relatively high shrinkage of the spin-on-glass material, defects or cracks 18 were generated in the substrate 10 proximate the relatively larger trench 12A for a field isolation region. Such cracks were typically not observed in the substrate 10 proximate the relatively smaller trenches 12.

FIG. 1C depicts another prior art technique wherein a layer of spin-on-glass material 16 was formed in the trenches 12, 12A, followed by the formation of a CVD-formed oxide material 20. As with the previously described process, a conformably deposited liner layer (not shown) comprised of silicon dioxide was formed in the trenches 12, 12A prior to the formation of the spin-on-glass material 16. Again, due to the relatively high shrinkage of the spin-on-glass material 16, defects or cracks 18 were generated in the substrate 10 proximate the relatively larger trench 12A for a field isolation region. Such cracks were typically not observed in the substrate 10 proximate the relatively smaller trenches 12 that were formed to define the fins 14.

FIGS. 1D-1E depict yet another prior art technique for forming isolation regions for a FinFET device. Initially, a first masking-etching process sequence was performed to form only the fin-forming trenches 12 in the substrate 10 Thereafter, as with the previously described processes, a conformably deposited liner layer (not shown) comprised of silicon dioxide was formed in the trenches 12. Then, as shown in FIG. 1D, a layer of spin-on-glass material 16 was formed in the trenches 12. A capping oxide layer 17 was then formed above the fin region of the substrate 10. Thereafter, as shown in FIG. 1E, a second masking-etching process sequence was performed to form the larger trench 12A. As with the previously described processes, a conformably deposited liner layer (not shown) comprised of silicon dioxide was formed in the trench 12A. Then, a CVD-formed oxide material 20 was formed in the relatively large trench 12A. While this prior art process flow eliminated the cracking problem adjacent the larger trench 12A, it is a much more complex and time-consuming process, requiring at least an additional masking-etching process sequence.

The present disclosure is directed to various methods of forming isolation regions for FinFET semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming isolation regions for FinFET semiconductor devices. One illustrative method disclosed herein includes forming a plurality of first trenches in a semiconducting substrate to define at least one fin for a FinFET device, forming a second trench in the substrate that is wider than the first trenches, forming a flowable oxide material in the first and second trenches and removing substantially all of the flowable oxide material from the second trench and a portion of the flowable oxide material from the first trenches, thereby leaving a residual portion of the flowable oxide material positioned in each of the first trenches. The method further includes performing a thermal growth process to form a thermal oxide material in the first trenches above the residual portions of the flowable oxide material and in the second trench, removing substantially all of the thermal oxide material from the second trench and a portion of the thermal oxide material from the first trenches, thereby leaving a residual portion of the thermal oxide material in each of the first trenches that is positioned above the residual portion of the flowable oxide material, performing a chemical deposition process to form a deposited silicon dioxide material in the first trenches above the residual portions of the thermal oxide material and in the second trench, removing the deposited silicon dioxide material from the first trenches and forming a gate structure around the fin of the device.

BRIEF DESCRIPTION OF THE DRAWINGS

The disclosure may be understood by reference to the following description taken in conjunction with the accompanying drawings, in which like reference numerals identify like elements, and in which.

Figure 1A:
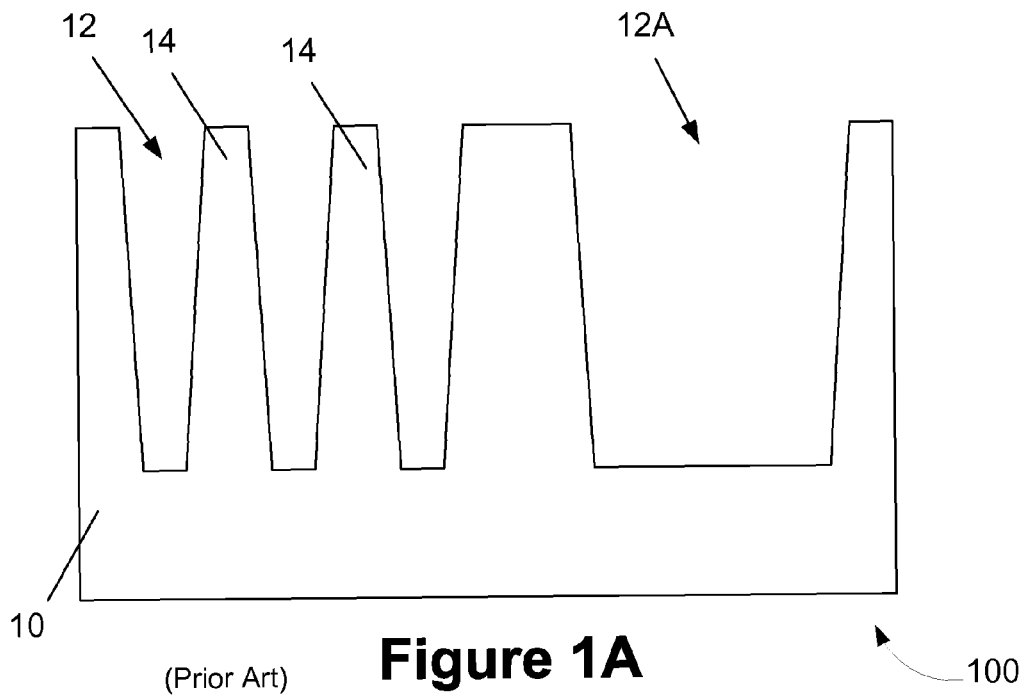
FIGS. 1A-1E depict various illustrative prior art methods for forming local isolation regions and field isolation regions for FinFET semiconductor devices.
Figure 1B:
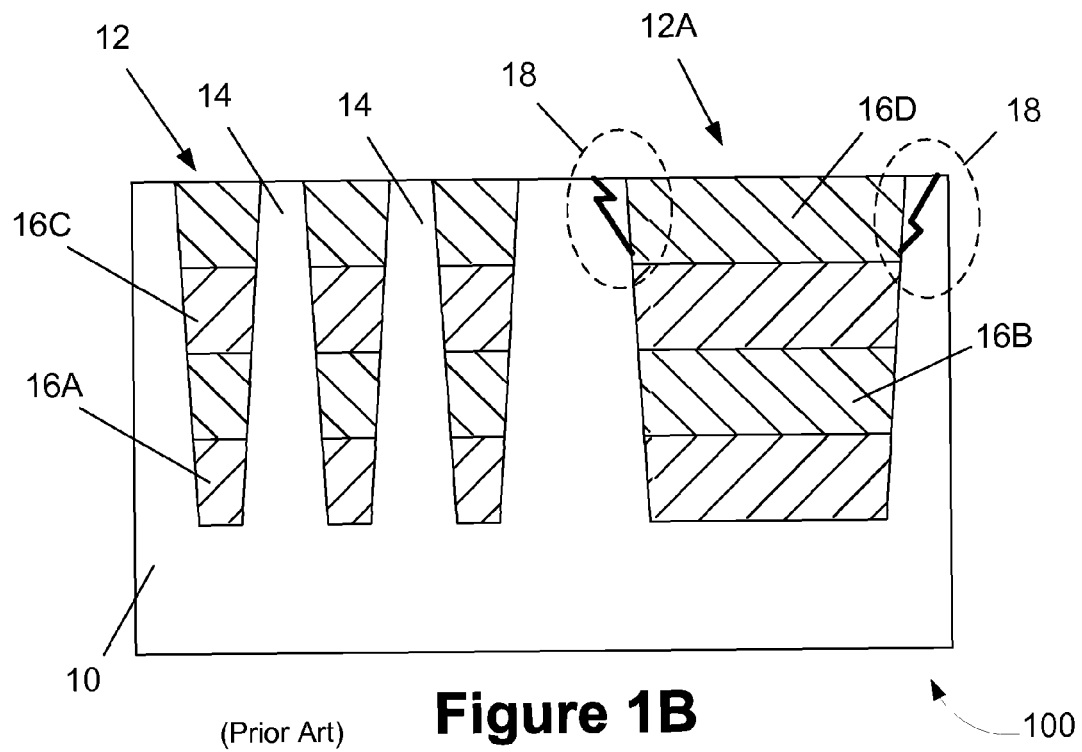
Figure 1C:
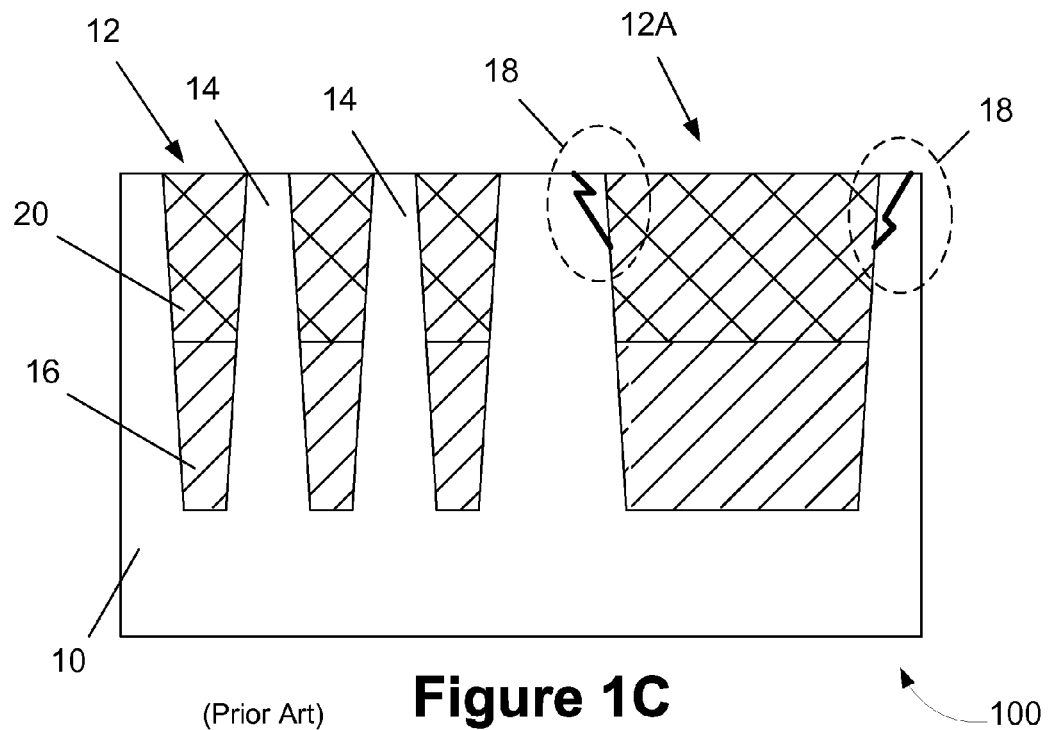
Figure 1D:
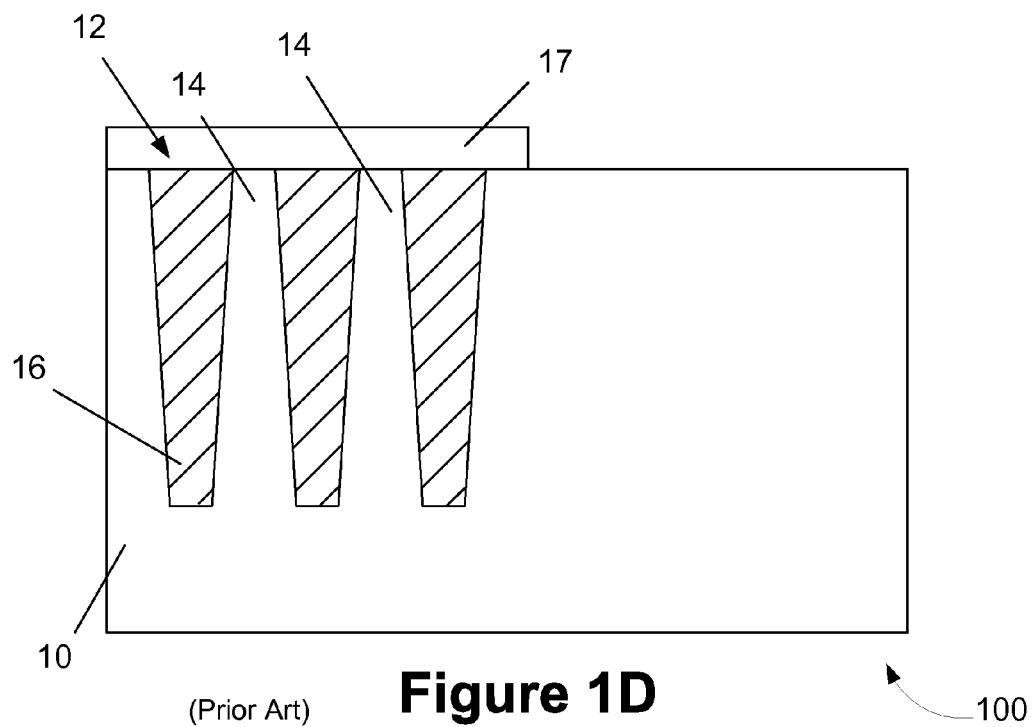
Figure 1E:
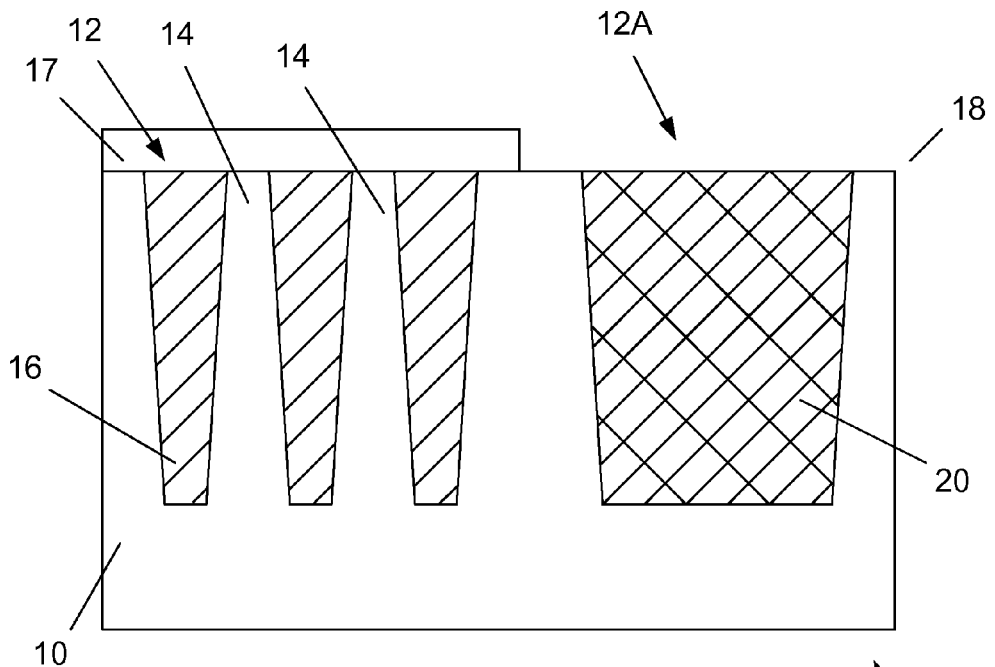

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming isolation regions for FinFET semiconductor devices. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

Figure 2A:
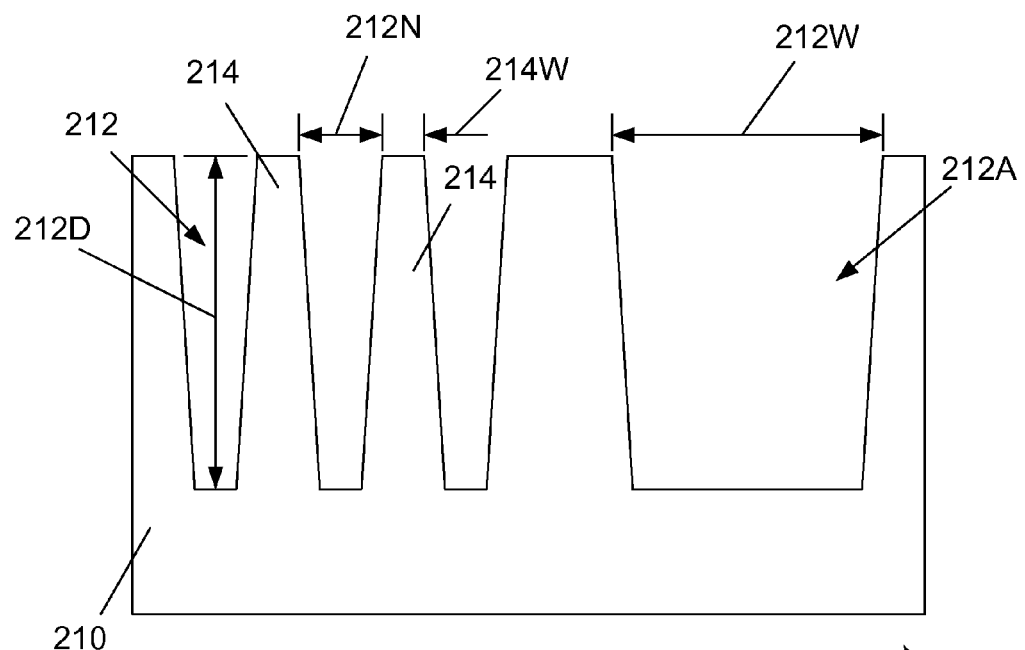
FIGS. 2A-2I depict illustrative methods disclosed herein for forming local isolation regions and field isolation regions for FinFET semiconductor devices.

FIG. 2A is a simplified view of an illustrative FinFET semiconductor device 200 at an early stage of manufacturing that is formed above a semiconducting substrate 210. The substrate 210 may have a variety of configurations, such as the depicted bulk silicon configuration. The substrate 210 may be made of silicon or it may be made of materials other than silicon. The substrate 210 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all forms of semiconducting materials.

In general, the present disclosure is directed to a novel method of forming local isolation regions for a FinFET semiconductor device and forming field isolation regions in the substrate 210. Using the methods disclosed herein, the problem of fin bending as described in the background section of this application may be avoided or reduced and the field isolation regions may be formed without the cracking problems seen with respect to some of the prior art process flows discussed previously.

As shown in FIG. 2A, one or more etching processes, such as a plurality of dry or wet etching processes, are performed through a patterned mask layer (not shown) comprised of, for example, silicon nitride, to form a plurality of relatively narrow fin-forming trenches 212 and a relatively wider trench 212A in the substrate 210. The trenches 212 define a plurality of fin structures 214. The wider trench 212A will eventually be filled with an insulating material and become, for example, a field isolation region formed in the substrate 210. In general, although the dimensions of the trenches 212, 212A and the fins 214 may vary depending upon the particular application, the trench 212A will be significantly wider than the fin-forming trenches 212. For example, the fin-forming trenches 212 may have a width 212N at the top of the trench 212 that is less than about 50 nm, while the width 212W of the wider trench 212A may be at least 500 µm. In one example, the width 214W of the fins 214 at the top of the fins 214 may be less than about 30 nm. However, the size and configuration of the trenches 212, 212A and the fins 214, as well as the manner in which they are made, should not be considered a limitation of the present invention unless such limitations are expressly recited in the attached claims.

Figure 2B:
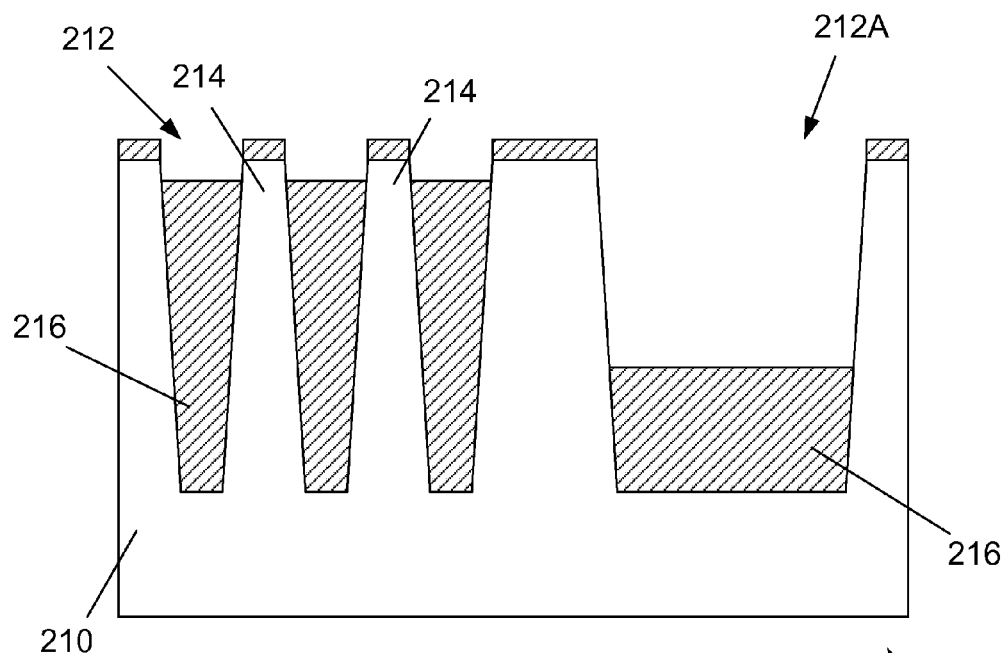

Next, as shown in FIG. 2B, a flowable oxide material 216 is formed in the trenches 212, 212A until such time as the fin-forming trenches 212 are significantly filled with the flowable oxide material 216. Due to the nature of the flowable oxide material 216, and the manner in which it is formed, a lesser amount of the flowable oxide material 216 will be formed in the wider trench 212A as compared to the narrower, fin-forming trenches 212. In one illustrative example, less than half of the wider trench 212A may be filled with the flowable oxide material 216. The flowable oxide material 216 is initially formed by a spin-coating or CVD technique and cured by performing a steam anneal process at a temperature of at least 200° C.

Figure 2C:
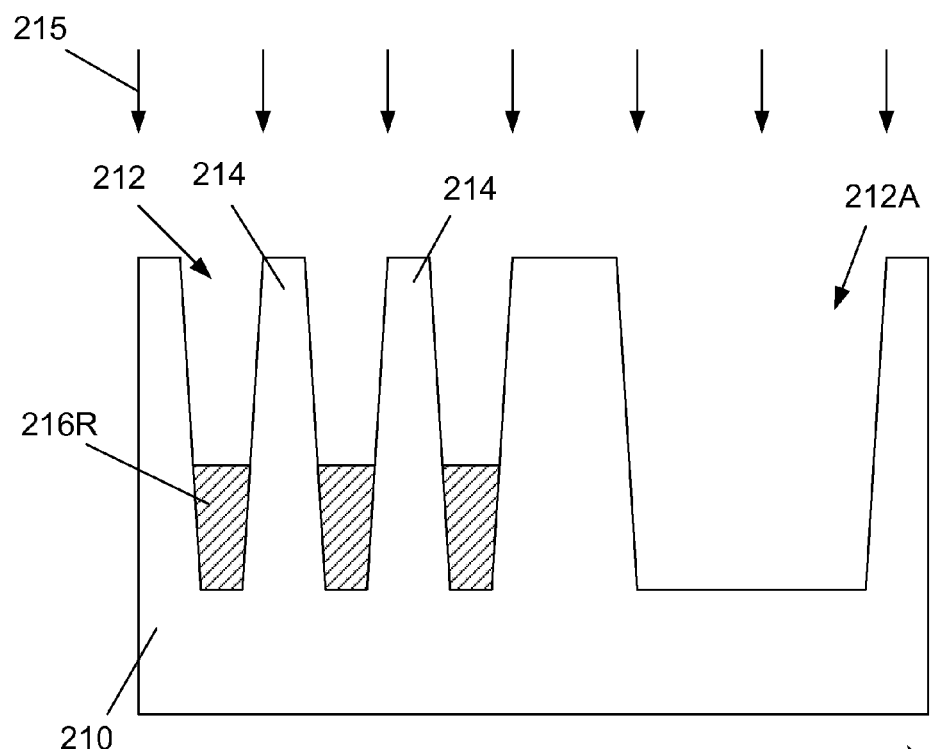

Next, as shown in FIG. 2C, a chemical oxide removal process 215 is performed to remove portions of the flowable oxide material 216 in the fin-forming trenches 212 and to remove substantially all of the flowable oxide material 216 from within the wider trench 212A. In one embodiment, the chemical oxide removal process 215 is a highly-controllable atomic layer removal process that may be performed using the SiCoNi process available from Applied Material or the well-known COR process from Tokyo Electron. The chemical oxide removal process 215 results in the definition of a reduced thickness portion of the flowable oxide 216R being positioned within the fin-forming trenches 212. The overall thickness of the reduced thickness portion of the flowable oxide 216R may vary depending upon the particular application. In one illustrative embodiment, the thickness of the flowable oxide material 216R after the chemical oxide removal process 215 is performed may be about 150-170 nm.

Figure 2D:
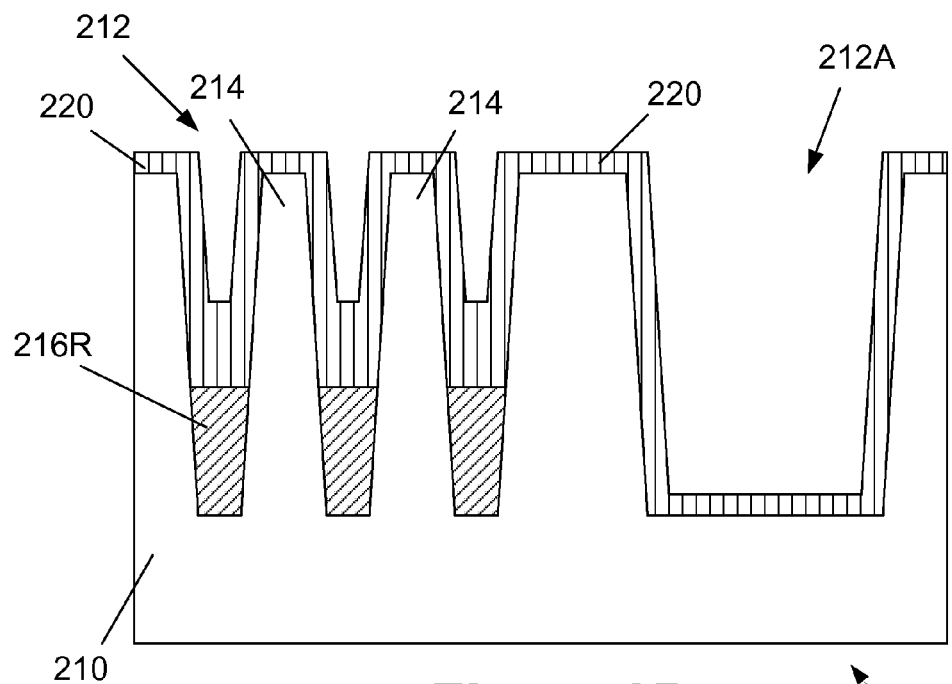

Next, as shown in FIG. 2D, a thermal growth process is performed to form a thermal oxide material 220 on the exposed portions of the substrate 210. As will be appreciated by those skilled in the art, the thermal oxide material 220 exhibits a relatively low etch rate as compared to other forms of silicon dioxide, i.e., the thermal oxide material 220 is more etch resistant than other forms of silicon dioxide. The thermal oxide material 220 may be formed by performing a thermal oxidation process in a furnace at a relatively high temperature, e.g., about 750-900° C. The thickness of the thermal oxide material 220 may vary depending upon the particular application. In one illustrative example where the fin-forming trenches 212 have a width 212N (see FIG. 2A), the thermal oxide material 220 may be formed to a thickness of about one-half of the width 212N. As a result, the thermal oxide material 220 will tend to completely fill the lower portions of the relatively narrow fin-forming trenches 212, as depicted in FIG. 2D. As a result of the high-temperature thermal growth process, the flowable oxide material will become denser.

Figure 2E:
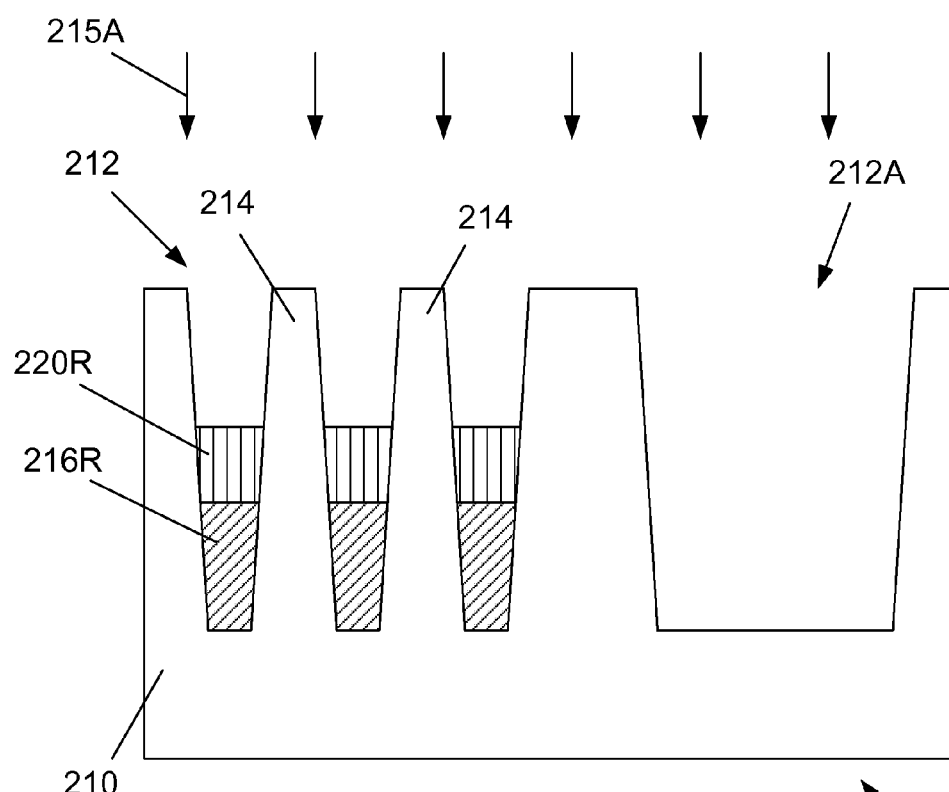

Next, as shown in FIG. 2E, another chemical oxide removal process 215A is performed to remove portions of the thermal oxide material 220 in the fin-forming trenches 212 and to remove substantially all of the thermal oxide material 220 from within the wider trench 212A. As noted above, the chemical oxide removal process 215A may be the SiCoNi process available from Applied Material or the well-known COR process from Tokyo Electron. The chemical oxide removal process 215A results in the definition of a reduced thickness portion of the thermal oxide material 220R being positioned within the fin-forming trenches 212 above the reduced thickness portion of the flowable oxide 216R. The overall thickness of the reduced thickness portion of the thermal oxide material 220R may vary depending upon the particular application. In one illustrative embodiment, the thickness of the thermal oxide material 220R after the chemical oxide removal process 215A is performed may be greater than one-half of the width 212N.

Figure 2F:
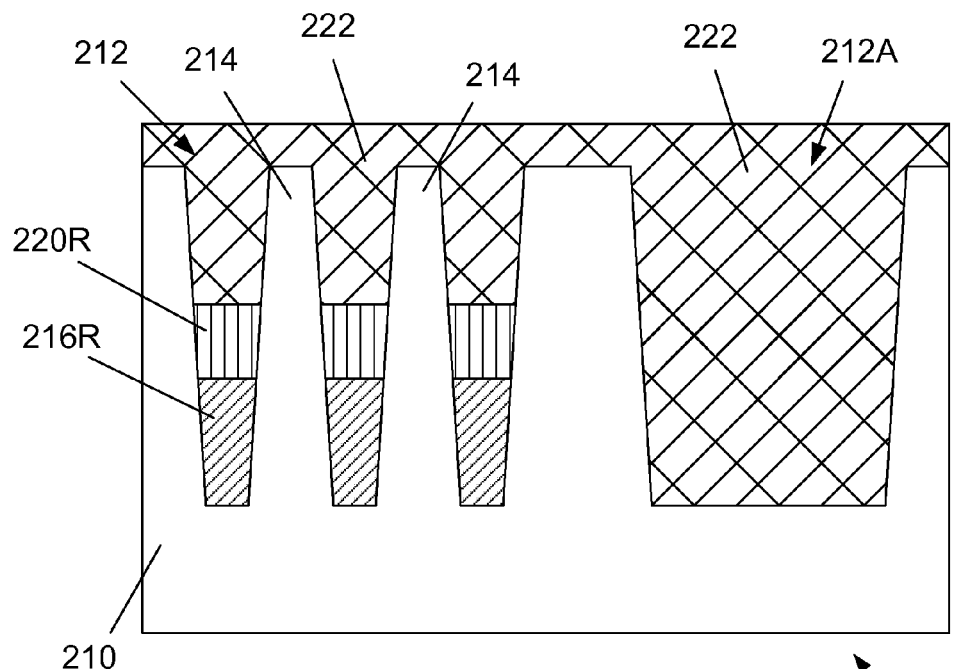

Next, as shown in FIG. 2F, a chemical vapor deposition (CVD) process is performed to form a layer of insulating material 222, such as silicon dioxide, on the device 200 so as to overfill the trenches 212, 212A. In one illustrative example, the layer of insulating material may be an HDP or HARP based oxide material. A relatively high-temperature densification process (about 900° C. or greater) may be performed at this point in the process flow.

Figure 2G:
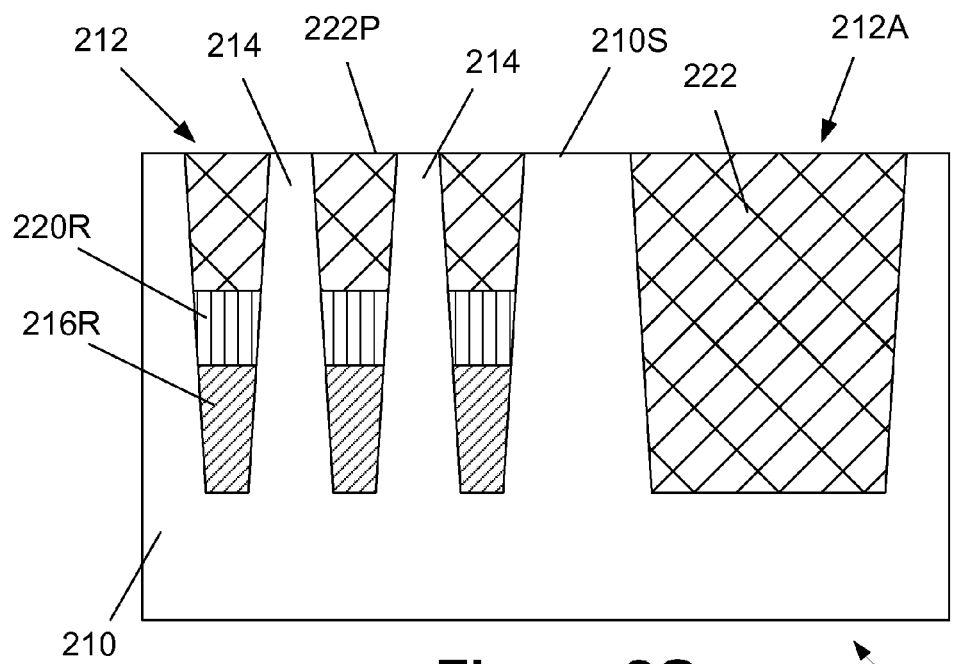

FIG. 2G depicts the device 200 after a chemical mechanical polishing (CMP) process has been performed on the layer of insulating material 222 that stops on the fins 214 (or a hard mask layer (not shown) that was employed in patterning the fins 214). This CMP process results in the layer of insulating material 222 having a polished surface 222P that is substantially planar with the upper surface 210S of the substrate 210.

Figure 2H:
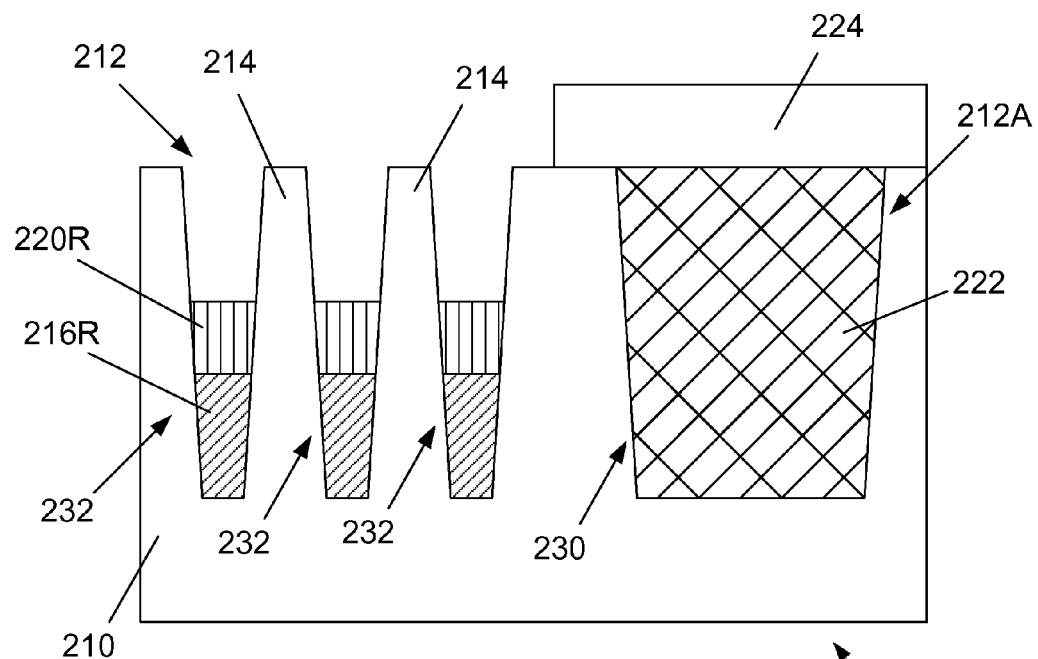

FIG. 2H depicts the device 200 after a patterned mask layer 224, e.g., a patterned photoresist mask, has been formed so as to cover the wider trench 212A while exposing the area above the narrower trenches 212. Thereafter, an etching process is performed to remove the layer of insulating material 222, e.g., a CVD oxide, within the trenches 212 to thereby expose the fins 214 for further process. The etching process may be a timed etching process or the relatively more etch resistant thermal oxide 220R may serve to stop the etching process that is performed to remove the insulating material 222. At this point, the device 200 is comprised of a field isolation region 230 and a plurality of composite local isolation regions 232. The composite local isolation regions 232 are comprised of the reduced thickness flowable oxide material 216R and the reduced thickness furnace oxide material 220R.

Figure 2I:
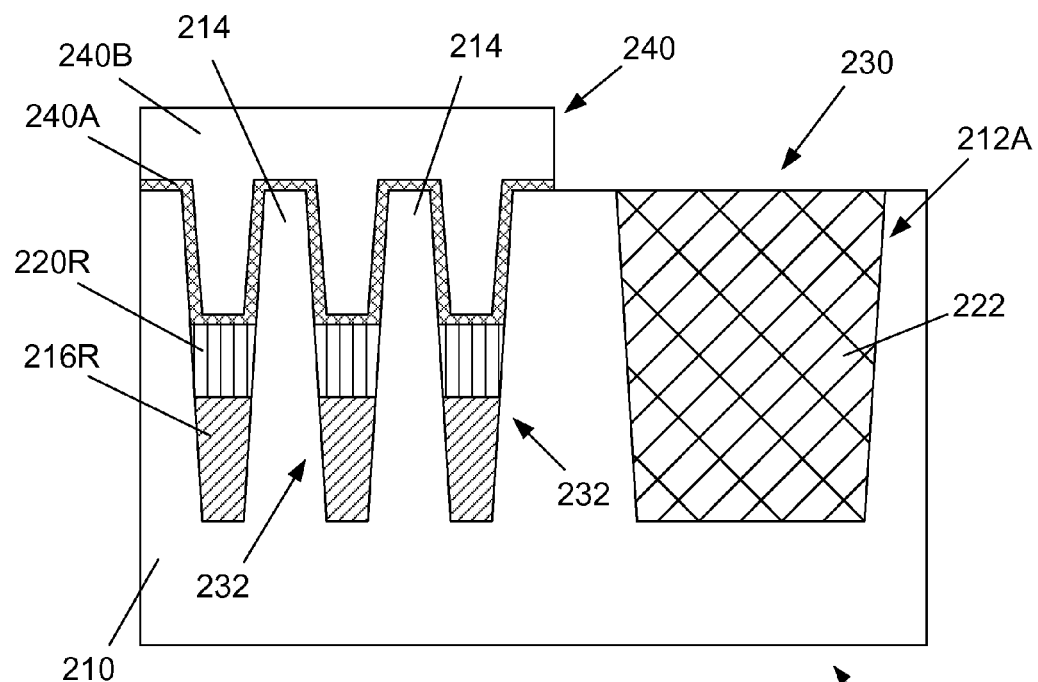

Next, as shown in FIG. 2I, the making layer 224 has been removed and various process operations have been performed to form an illustrative gate structure 240 for the FinFET device 200. The schematically depicted gate structure 240 includes an illustrative gate insulation layer 240A and an illustrative gate electrode 240B. An illustrative gate cap layer (not shown) may also be formed above the illustrative gate electrode 240B. As will be recognized by those skilled in the art after a complete reading of the present application, the gate structure 240 of the device 200 depicted in the drawings, i.e., the gate insulation layer 240A and the gate electrode 240B, is intended to be representative in nature. For example, the gate insulation layer 240A may be comprised of a variety of different materials, such as, for example, silicon dioxide, a so-called high-k (k greater than 10) insulation material (where k is the relative dielectric constant), etc. The gate electrode 240B may be comprised or one or more layers of conductive material, e.g., polysilicon, one or more layers of metal, etc. The gate structure 240 may be formed using either "gate-first" or "replacement-gate" techniques. At this point, traditional manufacturing techniques may be performed to complete the manufacture of the device 200.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a FinFET device, comprising:
   forming a plurality of spaced-apart first trenches in a semiconducting substrate, said first trenches defining at least one fin for said device, each of said first trenches having a first width at a top of said first trenches;
   forming a second trench in said substrate, said second trench having a second width at a top of said second trench, said second width being greater than said first width;
   forming a flowable oxide material in said first and second trenches;
   removing substantially all of said flowable oxide material from said second trench and a portion of said flowable oxide material from said first trenches, thereby leaving a residual portion of said flowable oxide material positioned in each of said first trenches;
   performing a thermal growth process to form a thermal oxide material in said first trenches above said residual portions of said flowable oxide material and in said second trench;
   removing substantially all of said thermal oxide material from said second trench and a portion of said thermal oxide material from said first trenches, thereby leaving a residual portion of said thermal oxide material in each of said first trenches that is positioned above said residual portion of said flowable oxide material;
   performing a chemical deposition process to form a deposited silicon dioxide material in said first trenches above said residual portions of said thermal oxide material and in said second trench;
   removing said deposited silicon dioxide material from said first trenches; and
   forming a gate structure around said at least one fin of said device.

2. The method of claim 1, wherein said first width is 50 nm or less.

3. The method of claim 2, wherein said second width is 500 μm or greater.

4. The method of claim 1, wherein said second trench is a trench for a field isolation region.

5. The method of claim 1, wherein the step of removing substantially all of said flowable oxide material from said second trench and said portion of said flowable oxide material from said first trenches comprises performing a first chemical oxide removal process to remove substantially all of said flowable oxide material from said second trench and said portion of said flowable oxide material from said first trenches.

6. The method of claim 5, wherein the step of removing substantially all of said thermal oxide material from said second trench and said portion of said thermal oxide material from said first trenches comprises performing a second chemical oxide removal process to remove substantially all of said thermal oxide material from said second trench and said portion of said thermal oxide material from said first trenches.

7. A method of forming a FinFET device, comprising:
   forming a plurality of spaced-apart first trenches in a semiconducting substrate, said first trenches defining at least one fin for said device, each of said first trenches having a first width at a top of said first trenches;
   forming a second trench in said substrate, said second trench having a second width at a top of said second trench, said second width being greater than said first width;
   forming a flowable oxide material in said first and second trenches;
   performing a first chemical oxide removal process to remove substantially all of said flowable oxide material from said second trench and a portion of said flowable oxide material from said first trenches, thereby leaving a residual portion of said flowable oxide material positioned in each of said first trenches;
   performing a thermal growth process to form a thermal oxide material in said first trenches above said residual portions of said flowable oxide material and in said second trench;
   performing a second chemical oxide removal process to remove substantially all of said thermal oxide material from said second trench and a portion of said thermal oxide material from said first trenches, thereby leaving a residual portion of said thermal oxide material in each of said first trenches that is positioned above said residual portion of said flowable oxide material;
   performing a chemical deposition process to form a deposited silicon dioxide material in said first trenches above said residual portions of said thermal oxide material and in said second trench;
   performing at least one chemical mechanical polishing process to remove excess portions of said deposited silicon dioxide material;

forming a masking layer above said deposited silicon dioxide material in said second trench;

after forming said masking layer, performing an etching process to remove said deposited silicon dioxide material from said first trenches; and forming a gate structure around said at least one fin of said device.

8. The method of claim 7, wherein said first width is 50 nm or less.

9. The method of claim 7, wherein said second width is 500 μm or greater.

10. A method of forming a FinFET device, comprising:

forming a plurality of spaced-apart first trenches in a semiconducting substrate, said first trenches defining at least one fin for said device, each of said first trenches having a first width at a top of said first trenches that is 50 nm or less;

forming a second trench in said substrate, said second trench having a second width at a top of said second trench, said second width being 500 μm or greater;

forming a flowable oxide material in said first and second trenches;

performing a first chemical oxide removal process to remove substantially all of said flowable oxide material from said second trench and a portion of said flowable oxide material from said first trenches, thereby leaving a residual portion of said flowable oxide material positioned in each of said first trenches;

performing a thermal growth process to form a thermal oxide material in said first trenches above said residual portions of said flowable oxide material and in said second trench;

performing a second chemical oxide removal process to remove substantially all of said thermal oxide material from said second trench and a portion of said thermal oxide material from said first trenches, thereby leaving a residual portion of said thermal oxide material in each of said first trenches that is positioned above said residual portion of said flowable oxide material;

performing a chemical deposition process to form a deposited silicon dioxide material in said first trenches above said residual portions of said thermal oxide material and in said second trench;

performing at least one chemical mechanical polishing process to remove excess portions of said deposited silicon dioxide material;

forming a masking layer above said deposited silicon dioxide material in said second trench;

after forming said masking layer, performing an etching process to remove said deposited silicon dioxide material from said first trenches; and forming a gate structure around said at least one fin of said device.

* * * * *